United States Patent [19]

Timm

[11] Patent Number: 5,898,420
[45] Date of Patent: Apr. 27, 1999

[54] INSTRUMENT WITH MAXIMUM DISPLAY UPDATE RATE AND MAXIMIZED DISPLAY BANDWIDTH GIVEN THE DISPLAY UPDATE RATE

[75] Inventor: Daniel P. Timm, Colorado Springs, Colo.

[73] Assignee: Hewlett-Packard Company, Palo Alto, Calif.

[21] Appl. No.: 08/910,184

[22] Filed: Aug. 13, 1997

[51] Int. Cl.$^6$ .................................................. G09G 5/36
[52] U.S. Cl. ................................... 345/134; 702/67
[58] Field of Search ............................... 345/134, 324; 382/207; 702/67

[56] References Cited

U.S. PATENT DOCUMENTS

| | | | |
|---|---|---|---|
| 3,683,398 | 8/1972 | Worley | 346/1 |
| 4,486,857 | 12/1984 | Heckel | 364/900 |
| 5,375,067 | 12/1994 | Berchin | 364/487 |
| 5,397,981 | 3/1995 | Wiggers | 324/121 R |
| 5,530,454 | 6/1996 | Etheridge et al. | 345/134 |
| 5,740,064 | 4/1998 | Witte et al. | 345/134 |
| 5,774,314 | 6/1998 | Eggen et al. | 360/137 |

OTHER PUBLICATIONS

M.S. Holcomb and D.P. Timm, "A High–Throughput Acquisition Architecture For A 100–MHZ Digitizing Oscilloscope", Hewlett–Packard Journal, vol. 43, No. 1, Feb. 1992, pp. 11–20.

R.A. Witte, "Sample Rate And Display Rate In digitizing Oscilloscopes", Hewlett–Packard Journal, vol. 43, No. 1, Feb. 1992, pp. 18–19.

S.B. Warntjes, "Sustained Sample Rate In Digital Oscilloscopes", Hewlett–Packard Journal, vol. 48, No. 2, Apr. 1997, pp. 23–25.

Primary Examiner—Mark K. Zimmerman
Assistant Examiner—Ronald Laneau
Attorney, Agent, or Firm—Augustus W. Winfield

[57] ABSTRACT

A signal acquisition and display system that always provides the maximum possible display bandwidth that can be provided by the system without causing the display update rate to be reduced below the maximum determined by the acquisition time window. The optimization does not require analysis of a separate acquisition and does not require a repetitive waveform. The acquisition system alternates between two sections of memory, so that the minimum display update time is the longer of the acquisition time window or the display plot time. The display record length is variable. The display record length is controlled to make the display plot time always equal to or slightly less than the acquisition time window. Therefore, display bandwidth is always at the maximum possible given the acquisition time window and the maximum display update rate determined by the acquisition time window. Display record lengths may be very long compared to typical previous instruments.

1 Claim, 1 Drawing Sheet

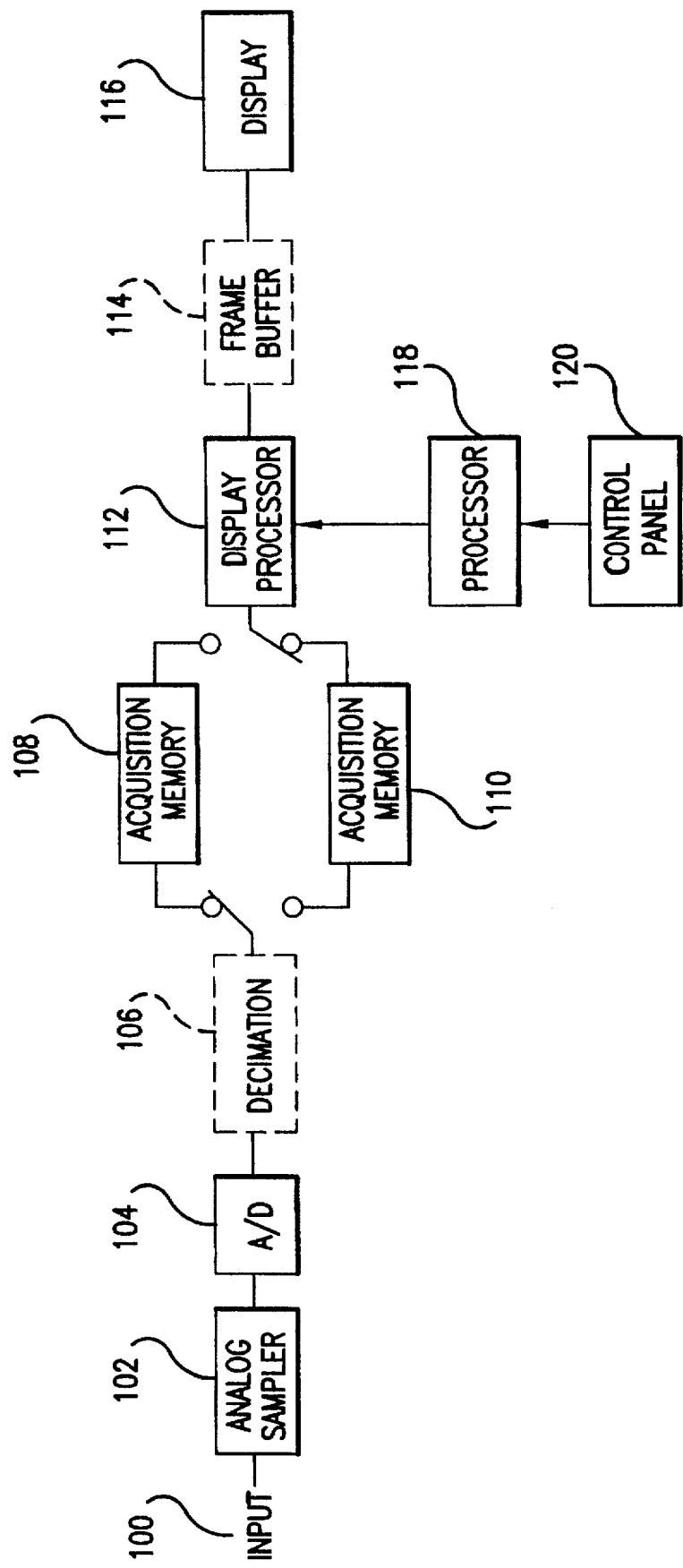

INSTRUMENT WITH MAXIMUM DISPLAY UPDATE RATE AND MAXIMIZED DISPLAY BANDWIDTH GIVEN THE DISPLAY UPDATE RATE

FIELD OF INVENTION

This invention relates generally to acquisition, digitization and display of electronic waveforms and more specifically to electronic instruments such as digital oscilloscopes.

BACKGROUND OF THE INVENTION

In a digital oscilloscope, or in a similar electronic instrument that digitizes and displays electronic waveforms, analog signals are sampled, the analog samples are then digitized by an analog-to-digital (A/D) converter, and the digital samples are stored in an acquisition memory (also called a capture memory). The digital samples are then processed (for example, perhaps filtered or interpolated) and the processed samples are written to a display memory or displayed directly. As will be discussed in more detail below, various trade-offs may be required among acquisition time window, display sample rate, display bandwidth and display update rate.

For the horizontal axis of the display, the operator of an oscilloscope (analog or digital) typically selects time-per-division (for example, 1.0 microsecond per horizontal centimeter on the face of the display). The input signal is then sampled for a total time (the acquisition time window) equal to the total time represented by the display. The number of acquisition samples (the acquisition record) is determined by the acquisition sample rate (samples per second) multiplied by the acquisition time window (seconds). Acquisition memory may be limited so that for some very long acquisition time windows a fraction (for example, every Nth sample) of the acquisition samples is stored. The maximum possible rate at which the display can be updated (display update rate) is the inverse of the operator selected acquisition time window. For example, if the operator selected acquisition time window is 0.01 seconds, the maximum display update rate is 100 updates per second. As discussed in more detail below, the actual display update rate may be less than the maximum.

Typically, digital oscilloscopes and similar waveform acquisition instruments can acquire and store data records much faster than they can process and display the records. For example, currently available analog-to-digital (A/D) converters can sample and convert a signal at the rate of several Gigasamples/second whereas currently available video processors can process these samples at a rate of several Megasamples per second. Assume that for a particular operator selected acquisition time window there are M acquired samples (acquisition record length) and N display samples (display record length) with M>N. One traditional solution is to display every (M/N)th acquired sample, selecting acquisition samples or interpolated acquisition samples by a process called decimation. Note, in this patent document, decimation is used generally to designate a system or filter with an input sample rate greater than or equal to an output sample rate. For example, if the instrument acquires 10,000 samples and displays 2,000 samples, every 5th acquisition sample may be displayed. In general, decimation may include digital filtering so that, for example, if the instrument acquires 10,000 samples and displays 3,000 samples, the displayed samples may be obtained by filtering/interpolation. Typically, for digital oscilloscopes, the display record length is fixed.

Ideally, the display sample rate is sufficiently high to approach continuous waveform display as in an analog oscilloscope. The term "bandwidth" usually refers to the highest frequency that can be reproduced in sampled form, which according to basic sampling theory is one half the sample rate (also known as the Nyquist rate). If the acquisition samples are decimated for display, then there is an acquisition bandwidth and a separate display bandwidth. The display record length is the display sample rate multiplied by the operator selected acquisition time window. Typically, the display record length is fixed and the display bandwidth is variable as determined by the operator selected acquisition time window. Therefore, in general, there is a need for very long display record lengths to permit high display bandwidths for all operator selected acquisition time windows.

Ideally, the display update rate is high to maximize the amount of information presented to the operator. A high display update rate is particularly important for capturing intermittent events and amplitude varying signals. As discussed above, the maximum display update rate is determined by the operator selected acquisition time window. Note that cathode ray tubes and other display technologies may have an image refresh rate. In this patent document, display update rate is determined by the time required to acquire and plot all the display samples (the display record) and is not related to the refresh rate of the particular display technology.

For additional background, see for example, M. S. Holcomb and D. P. Timm, "A High-Throughput Acquisition Architecture for a 100-MHZ Digitizing Oscilloscope," *Hewlett-Packard Journal*, Vol. 43, no. 1, February 1992, pp 11–20, R. A. Witte, "Sample Rate and Display Rate in Digitizing Oscilloscopes," *Hewlett-Packard Journal*, Vol. 43, no. 1, February 1992, pp. 18–19 and S. B. Warntjes, "Sustained Sample Rate in Digital Oscilloscopes," *Hewlett-Packard Journal*, Vol. 48, no. 2, April 1997, pp. 23–25.

Some instruments in the past have provided manual control over various acquisition and display parameters, thereby permitting operator control of various trade-offs. In addition, several approaches have been taken for automatically providing various optimal measurement parameter values. Prior approaches for automatic optimization typically require a preliminary acquisition of a signal followed by analysis of the preliminary signal acquisition, and then a second acquisition using optimized parameters based on the analysis of the preliminary acquisition. For example, in U.S. Pat. No. 5,375,067 (Berchin), sampling rate is automatically adjusted based on analysis of a preliminary acquisition. In Berchin, a waveform is first digitized using maximum sampling rate and maximum record length. A spectral analysis is performed on the preliminary acquisition. Sampling rate is then set to twice the frequency of the highest frequency component having an amplitude that exceeds a maximum aliasing level, and then the waveform is reacquired with the new sampling rate. In U.S. Pat. No. 5,397,981 (Wiggers), for repetitive signals, sampling rate is constant, and record length is automatically adjusted based on analysis of a preliminary acquisition. In Wiggers, a repetitive signal is acquired and sampled, the time period for one cycle is measured, and the number of samples is adjusted to maintain a constant display time for any signal repetition rate. Note in particular in Wiggers that the acquisition time window is not selected by an operator, but instead the acquisition time window is automatically adjusted to fit a cycle time of a repetitive signal.

There is a general need for automatic optimization of display bandwidth, given a particular operator selected acquisition time window, without requiring a reduction in the display update rate below the maximum rate determined by the acquisition time window. In particular, there is a need for automatic optimization of display bandwidth without requiring a preliminary acquisition and analysis and without requiring a change in the operator selected acquisition time window. In addition, there is a need for automatic optimization of display bandwidth for waveforms other than repetitive waveforms.

SUMMARY OF THE INVENTION

A signal acquisition system is disclosed that, given an operator selected acquisition time window, always provides the maximum possible display bandwidth that can be provided by the system without causing the display update rate to be reduced from the maximum display update rate determined by the acquisition time window, without requiring analysis of a separate acquisition, and without requiring operator intervention or control. In a system in accordance with the invention, the acquisition system alternates among at least two sections of memory, so that the minimum display update time is the longer of the acquisition time window or the display plot time. Instead of making the display record length fixed, the display record length is automatically adjusted to make display plot time equal to or slightly less than the operator selected acquisition time window. Therefore, the display update rate is always at the maximum possible given the operator selected acquisition time window, and the display bandwidth is maximized given the operator selected acquisition time window and the display update rate. Acquisition sample rate is approximately constant at the maximum sample rate unless the acquisition record exceeds the acquisition memory block. The ratio of acquisition sample rate to display sample rate is approximately constant when the acquisition sample rate is at the maximum rate.

Instruments in accordance with the invention then have the following attributes:

1. Acquisition sample rate is constant at the maximum rate except where limited by acquisition memory size.
2. Acquisition record lengths are permitted to vary to keep the acquisition bandwidth maximized.
3. The ratio of acquisition sample rate to display sample rate is approximately constant (>1.0) when the acquisition sample rate is at the maximum.
4. Display record lengths are variable so that display plot time is always equal to or slightly less than the acquisition time window.
5. Display bandwidth is the maximum possible without causing the display update rate to be reduced below the maximum rate determined by the acquisition time window.

BRIEF DESCRIPTION OF THE DRAWINGS

The FIGURE is a block diagram of an instrument for digitizing and displaying waveforms in accordance with the invention.

DETAILED DESCRIPTION OF THE PREFERRED EMBODIMENT OF THE INVENTION

The FIGURE illustrates an instrument in accordance with the invention. An electronic input waveform 100 is sampled by an analog sampler 102 at an acquisition sample rate. The acquisition sample rate as measured at the analog sampler 102 is approximately constant at the maximum sample rate. The qualifier "approximately" is used because the sample clock frequency may be randomly varied slightly (called dithering), deliberately, to avoid some aliasing problems. Therefore, more precisely, for most operator selected acquisition time windows, waveforms are always sampled at the full sample clock rate, which may have some deliberate small variation. Each analog sample is digitized by an analog to digital converter 104. If the required acquisition record exceeds the available acquisition memory (for very slow sweep speeds), decimation (106) of the digitized acquisition samples is required before storing into memory, thereby reducing the effective acquisition sample rate of the stored samples.

In earlier digital oscilloscopes, acquisition and display were serial processes. Display update time was the sum of the acquisition time window and the display plot time. One improvement for faster display update is to provide multiple acquisition memories (or multiple divisions of a single large memory), so that while one capture memory is being used to acquire new data, a separate capture memory is providing previously written data for display processing. See, for example, U.S. patent application Ser. No. 08/607,671.

Accordingly, in the FIGURE, acquisition records are alternately stored in a first acquisition memory 108 and a second acquisition memory 110. There may be more than two acquisition memory sections. Previously stored digital samples are processed (decimated) by a display processor 112. The display processor outputs a display record (number of display samples) at a display sample rate. In the FIGURE, a frame buffer 114 is illustrated but in some systems a display processor may write directly to a display 116 without intermediate storage. Display record lengths may be very long compared to typical previous instruments. The instrument control panel 120 interacts with a processor 118. The processor 118 controls the display processor 112. An operator selects an acquisition time window at the control panel 120. For any given operator selected acquisition time window, the processor 118 controls the display processor 112 to adjust its decimation rate.

Traditionally, display record lengths for digital oscilloscopes have been fixed or manually adjustable. Wiggers is an exception, where acquisition time windows and display record lengths are computed based on analysis of a preliminary acquisition of a repetitive signal to accommodate a cycle of a repetitive signal. If the display record length is fixed, and acquisition record length is permitted to be arbitrarily long to maintain maximum acquisition bandwidth, then the acquisition time window may be longer than the display plot time. When acquisition and display are parallel processes, the minimum display update time then becomes the longer of the acquisition time window or the display plotting time. If the display update rate is limited by the acquisition time window, then the display bandwidth may be increased without affecting the display update time by increasing the display record length. Conversely, if the display update time is limited by the display plotting time, the display update time may be decreased by reducing the display record length. The improvement, in accordance with the invention, is to always make the display plot time approximately equal to or slightly less than the acquisition time window so that the display update rate is always determined by the acquisition time window. Since acquisition record lengths are variable, display record lengths must also be variable. In general, the ratio of acquisition sample rate to display sample rate then remains constant when the acquisition sample rate is at the maximum (when the acquisition record length does not exceed the available acquisition memory). For any given operator selected acquisition time window, the display processor 112, as commanded by the processor 118, adjusts the display record length to make the display plot time slightly less than or equal to the acquisition plot time. By varying the display record length to keep the display plot time slightly less than or equal to the acquisition time window, the display bandwidth is the maximum possible without reducing the display update rate below the maximum rate determined by the acquisition time window.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for displaying digitized samples of a waveform, the method comprising:

reading, by a display processor, the digitized samples, within an acquisition time window;

decimating, by the display processor, the digitized samples, thereby generating display samples having a display record length, the display processor requiring a display plot time to display the display samples; and adjusting, by the display processor, the display record length to make the display plot time substantially equal to but not greater than the acquisition time window.

* * * * *